United States Patent [19]

Matsuura et al.

[11] Patent Number: 4,723,221

[45] Date of Patent: Feb. 2, 1988

[54] METHOD FOR MANUFACTURING SEMICONDUCTOR DEVICE AND APPARATUS THEREFOR

[75] Inventors: Toshio Matsuura, Koshigaya; Satoru Shikata, Kawasaki, both of Japan

[73] Assignee: Nippon Kogaku K.K., Tokyo, Japan

[21] Appl. No.: 59,193

[22] Filed: Jun. 5, 1987

Related U.S. Application Data

[63] Continuation of Ser. No. 674,841, Nov. 26, 1984, abandoned.

[30] Foreign Application Priority Data

Nov. 26, 1983 [JP] Japan .................................. 58-222926

[51] Int. Cl.⁴ .............................................. G01B 11/00
[52] U.S. Cl. ..................................... 364/559; 356/400; 356/401; 364/490
[58] Field of Search ................ 364/468, 488–491, 364/559; 356/399, 400, 401; 358/101, 107; 318/640

[56] References Cited

U.S. PATENT DOCUMENTS

| | | | |
|---|---|---|---|
| 4,233,625 | 11/1980 | Altman | 356/400 X |
| 4,325,077 | 4/1982 | Dunham | 358/107 |
| 4,423,959 | 1/1984 | Nakazawa et al. | 356/400 |
| 4,553,845 | 11/1985 | Kuroki et al. | 356/400 |
| 4,563,094 | 1/1986 | Yamada | 356/400 X |

*Primary Examiner*—Joseph Ruggiero
*Attorney, Agent, or Firm*—Shapiro and Shapiro

[57] ABSTRACT

A process and an apparatus for positioning a substrate provided with at least an alignment mark (reference pattern) and other patterns irrelevant to the alignment such as circuit patterns, are featured by obtaining photoelectric signals corresponding to the pattern distribution in a scanning area extending over a determined length in a scan direction crossing said reference pattern at a determined angle and containing the reference pattern, identifying that a photoelectric signal satisfying at least a condition in the scan direction is generated by the reference pattern and aligning the substrate according to thus identified photoelectric signal.

13 Claims, 16 Drawing Figures

METHOD FOR MANUFACTURING SEMICONDUCTOR DEVICE AND APPARATUS THEREFOR

This is a continuation application of Ser. No. 674,841 filed Nov. 26, 1984 now abandoned.

BACKGROUND OF THE INVENTION

1. Field of the Invention

The present invention relates to a method and an apparatus for positioning adapted for use in an exposure apparatus for manufacturing semiconductor devices, and more particularly to a method and an apparatus, in positioning a substrate provided with at least a registration mark and other patterns, for positioning by distinguishing said mark from said other patterns.

2. Description of the Prior Art

With the progress toward finer patterns in semiconductor devices, particularly in large-scale integrated circuits, there are commonly employed reduced projection exposure apparatus for circuit pattern printing in order to meet the requirements of fine pattern definition and a high productivity. Such conventional apparatus projects a reticle pattern, which is larger for example 5 times than the pattern size desired on the silicon wafer, in a reduced size through a projection lens, thus exposing a square area with a diagonal length of 21 mm or shorter on the wafer in one exposure. Consequently, in order to print the circuit patterns on the entire surface of a wafer of a diameter of ca. 125 mm, there is employed a so-called step-and-repeat process in which the wafer is placed on a movable stage and is subjected to repeated exposures with stepwise movement.

In the manufacture of large-scale integrated circuits, there are formed patterns of at least several layers on a wafer in succession, and the desired function cannot be attained due to deficient conductivity or insulation unless the error in superposition or positional aberration between the patterns of different layers is maintained under a determined limit. For example, in a circuit with a minimum line width of 1 $\mu$m, there is only permitted a positional aberration of 0.2 $\mu$m at maximum.

In the reduced projection exposure process, the pattern registration, namely the registration of a projected reticle pattern with a pattern already formed on the wafer, is achieved either by the off-axis method or by the through-the-lens method. In any case, the wafer is subjected to a rough alignment, called pre-alignment, when placed on the stage, and, if said pre-alignment is not precise enough, the registration mark formed on the wafer is significantly displaced from the central detecting position in an alignment microscope in case of the off-axis method or in a detecting system in case of the through-the-lens method. This leads to an erroneous detection of another pattern as the registration mark and eventually gives rise to an error in registration.

SUMMARY OF THE INVENTION

In consideration of the foregoing, an object of the present invention is to provide a method and an apparatus for registration of a substrate represented by a wafer for semiconductor device manufacture, by correctly recognizing an alignment mark even if the precision of pre-alignment is insufficient.

More specifically, the present invention provides a method and an apparatus for positioning a substrate provided with at least an alignment mark (reference pattern) and other patterns irrelevant to the alignment such as circuit patterns, which are featured by obtaining photoelectric signals corresponding to the pattern distribution in a scanning area extending over a determined length in a scan direction crossing said reference pattern at a determined angle and containing said reference pattern, identifying that a photoelectric signal satisfying at least a condition in the scan direction is generated by said reference pattern and aligning the substrate according to the thus identified photoelectric signal.

Said condition in the scan direction in said photoelectric identification is for example the absence of any patterns in a determined range in front of and behind the reference pattern in the scan direction, or, in case of use of a reference pattern composed of plural marks, the confirmation of the distance therebetween in the scan direction.

DETAILED DESCRIPTION OF THE PREFERRED EMBODIMENTS

Figure 1:
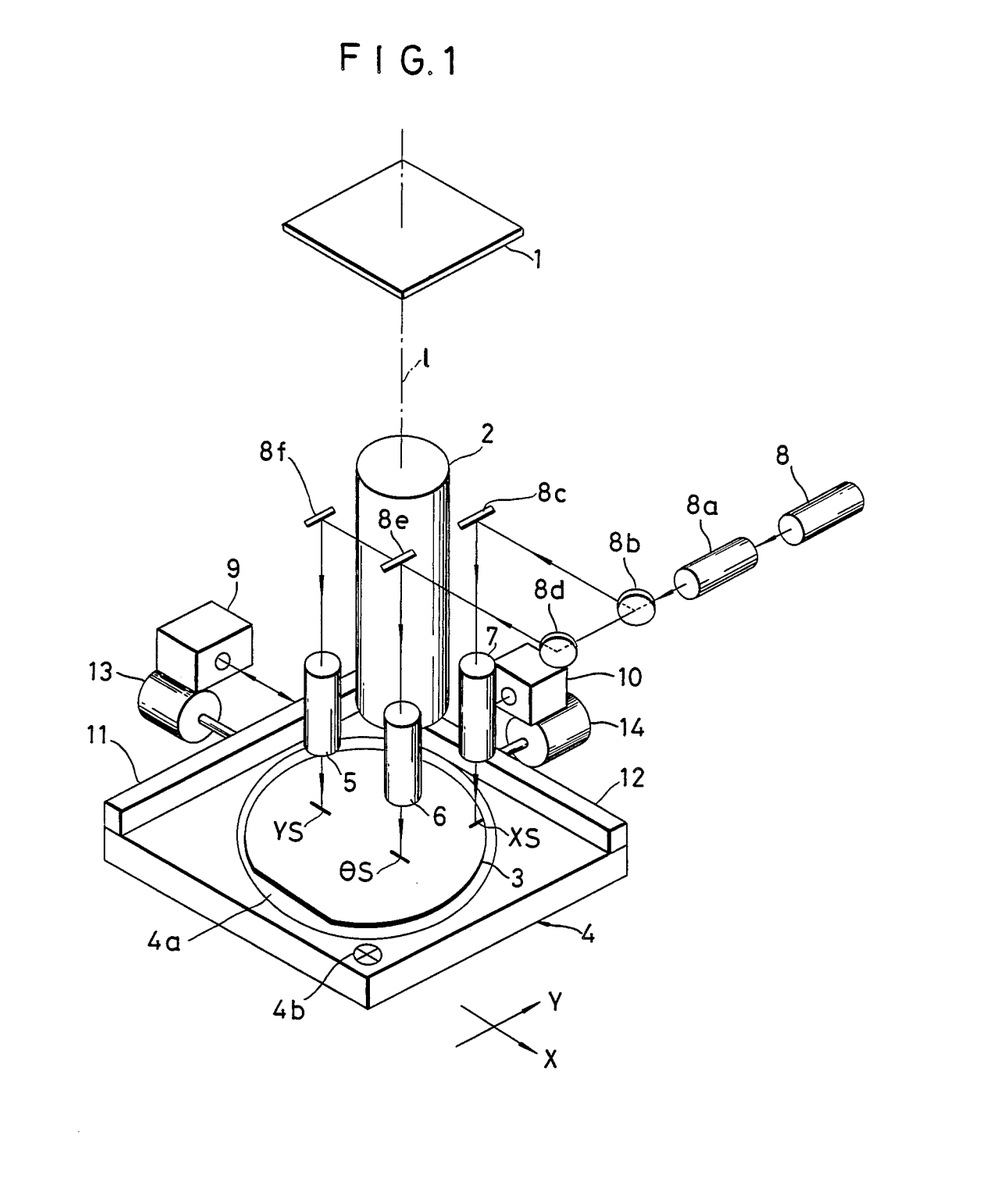
FIG. 1 is a schematic perspective view of a reduced projection exposure apparatus in which the present invention is applicable.

FIG. 1 is a schematic perspective view of a reduced projection exposure apparatus in which the present invention is applicable. A photomask or a reticle (hereinafter collectively called reticle) 1 bearing determined circuit patterns is illuminated by the light from an unrepresented light source. A reduced projection lens 2 projects the pattern image of the reticle 1 in a reduced size onto a wafer 3 coated with a photosensitive material. A two-dimensionally movable stage 4, supporting said wafer 3, moves along an illustrated orthogonal coordinate system X-Y. The stage 4 is provided with a θ-table 4a which is rotatable to the stage 4 and is capable of fixing the wafer 3 by suction. The stage 4 is further provided with a mark plate 4b (hereinafter called reference mark) used as the reference in the alignment. For off-axis alignment of the wafer 3, there are provided three alignment microscopes 5, 6, 7 around the projection lens 2, with optical axes parallel to the optical axis 1 of said projection lens 2. The microscope 5 will be called Y-microscope as it is used for detecting the positional aberration of the wafer 3 in the Y-direction, while the microscope 6 will be hereinafter called θ-microscope as it is used for detecting the rotational aberration of the wafer 3 in combination with the Y-microscope 5, and the microscope 7 will be called X-microscope as it is used for detecting the positional aberration of the wafer 3 in the X-direction. A helium-neon laser 8 (hereinafter called laser light source) generates a laser beam of a wavelength to which the photosensitive material on the wafer 3 is insensitive. An optical member 8a is provided with a beam expander and a cylindrical lens to convert the laser beam from the laser light source 8 into a parallel beam of an oval cross section. The parallel light beam from the optical member 8a is divided into two by means of a beam splitter 8b, and one of thus divided beams enters the X-microscope 7 after being reflected by a mirror 8c, while the other is reflected by a mirror 8d and again divided into two by a beam splitter 8e. One of thus divided beams enters the θ-microscope 6 while the other enters the Y-microscope 5 after being reflected by a mirror 8f. Through the function of the cylindrical lens provided in the optical member 8a, the laser beams entering the microscopes 5, 6, 7 respectively form small oval light spots YS, θS, XS on the wafer 3. The spots YS and θS are so defined as to extend in the X-direction while the light spot XS is so defined as to extend in the Y-direction. Also the Y-microscope 5 and θ-microscope 6 are so positioned that the line connecting the light spots YS and θS lies in the X-direction. These light spots YS, θS, XS are used in conjunction with alignment marks or reference marks formed on the wafer 3. An X-interferometer block 9 is provided at the side of the stage 4, to project a laser beam of a stable frequency to a mirror 11 movable in the X-direction and having a reflecting face extending in the Y-direction and to a reference mirror provided in said block 9. The position of the stage 4 in the X-direction is detected by causing interference between the reflected light from the mirror 11 and said reference mirror, and photoelectrically detecting the change in the interference pattern. Said detection can be achieved with a resolving power of 0.02 μm due to the satisfactory stability of wavelength of the laser beam. On the other hand a Y-interferometer block 10 of a same structure as that of the block 9 projects a laser beam onto a mirror 12 movable in the Y-direction and extending in the X-direction on the stage 4 and detects the position thereof in the Y-direction with a resolving power of 0.02 μm. A driving unit 13 linearly moves the stage 4 in the X-direction while a driving unit 14 linearly moves the stage 4 in the Y-direction, whereby the stage 4 can be brought to a two-dimensionally arbitrary position.

Figure 2:
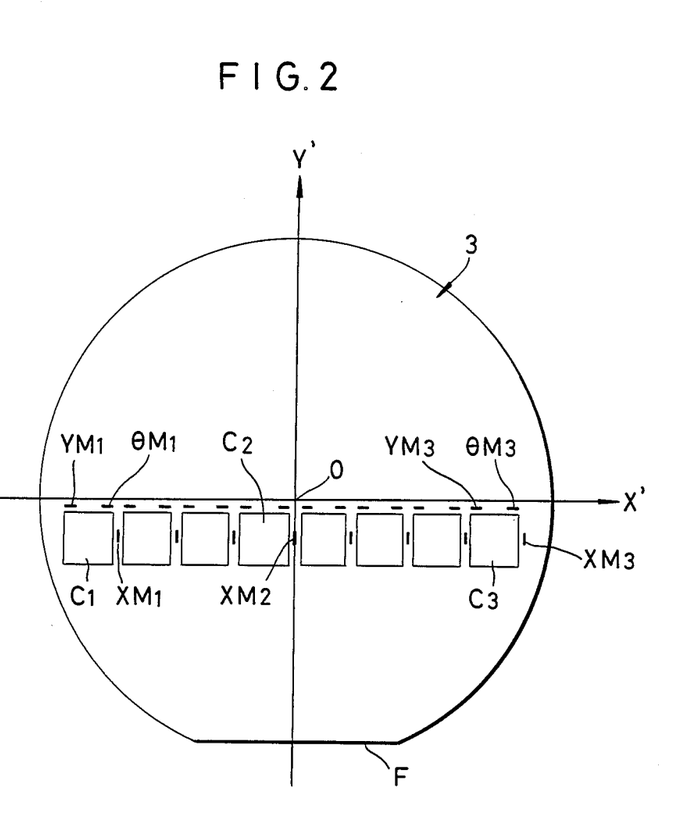
FIG. 2 is a plan view showing chips and marks formed on a wafer.
Figure 3:
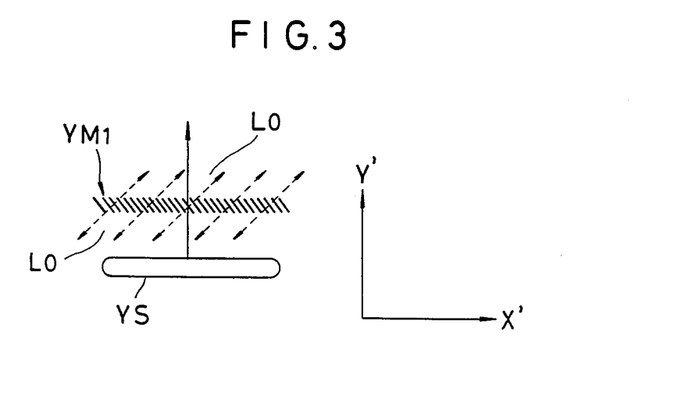
FIG. 3 is a schematic view showing the relation between the marks and the light spot.

FIG. 2 shows an example of the wafer 3 placed on the stage 4. The wafer 3 for example bears patterns of a first layer through step-and-repeat exposures of the pattern of the reticle 1 by means of the exposure apparatus shown in FIG. 1. In FIG. 2 there is shown only one line of patterns out of plural patterns formed in matrix on the wafer 3. The wafer 3 is provided, in a part of the periphery thereof, with a linear cut-off area (hereinafter called flat) F, and the wafer 3 is pre-aligned, by means of an unrepresented pre-aligning device, in such a manner that said flat F becomes parallel to the X-direction shown in FIG. 1. The patterns of the first layer, formed of minute geometrical surface irregularities, are arranged in a matrix on the wafer 3, depending on the precision of said pre-alignment. The coordinates of said matrix will be called the arrangement coordinate X', Y', and plural rectangular patterns formed according to said coordinate X', Y' will be called chips. Said arrangement coordinate system X', Y' cooresponds to the movement coordinate system X, Y of the stage 4, and the original point of said coordinate system X', Y' is selected at the approximate center of the wafer 3. Each of the plural chips formed along the X'-axis of the coordinate system X'Y' is associated with three marks or reference patterns YM, θM, XM composed of surface irregularities. The marks YM and θM are alternately positioned linearly along the X'-axis, and the distance between the marks YM and θM in the X'-direction for each chip is same. Among these plural marks YM, θM, XM, a mark YM1 accompanying a chip C1 at the left-hand end of the wafer 3, a mark XM2 accompanying a chip C2 at the center and a mark θM3 accompanying a chip C3 at the right-hand end are used for global alignment of the wafer 3. For this reason the distance between the marks YM and θM in a chip is so designed that the distance in the X'-direction between the marks YM1 and θM3 corresponds with the distance in the X-direction between the light spots YS and θS. In FIG. 2, the Y'-axis passes the mark XM2, but the Y'-axis may be selected at another position, for example passing the mark XM1. The rotary center of the θ-table 4a supporting the wafer 3 does not coincide with the center O of the wafer 3 and is positioned at or close to the mark YM1 of the chip C1. The mark YM, θM or XM on the wafer 3 has so-called lattice structure composed of small linear elements arranged at a determined pitch in a direction as shown in FIG. 3, and each of said small linear elements is inclined by 45° to the axis X' or Y'. FIG. 3 shows the positional relationship between the light spot YS and the mark YM1 composed of plural small linear elements inclined by 45° and arranged linearly in the X'-direction, The mark θM3 has an identical structure, and the XM2 is composed of plural small linear elements inclined by 45° and linearly arranged in the Y'-directron. The mark YM1, when illuminated by the light spot YS, generates a diffracted light Lo depending on the wavelength of the light spot YS or the wavelength of the helium-neon light beam and the pitch of the lattice. In the present embodiment it is assumed, that the width of the light spot is approximately the same as that of the mark, and that the mark is longer than the light spot.

Figure 4:
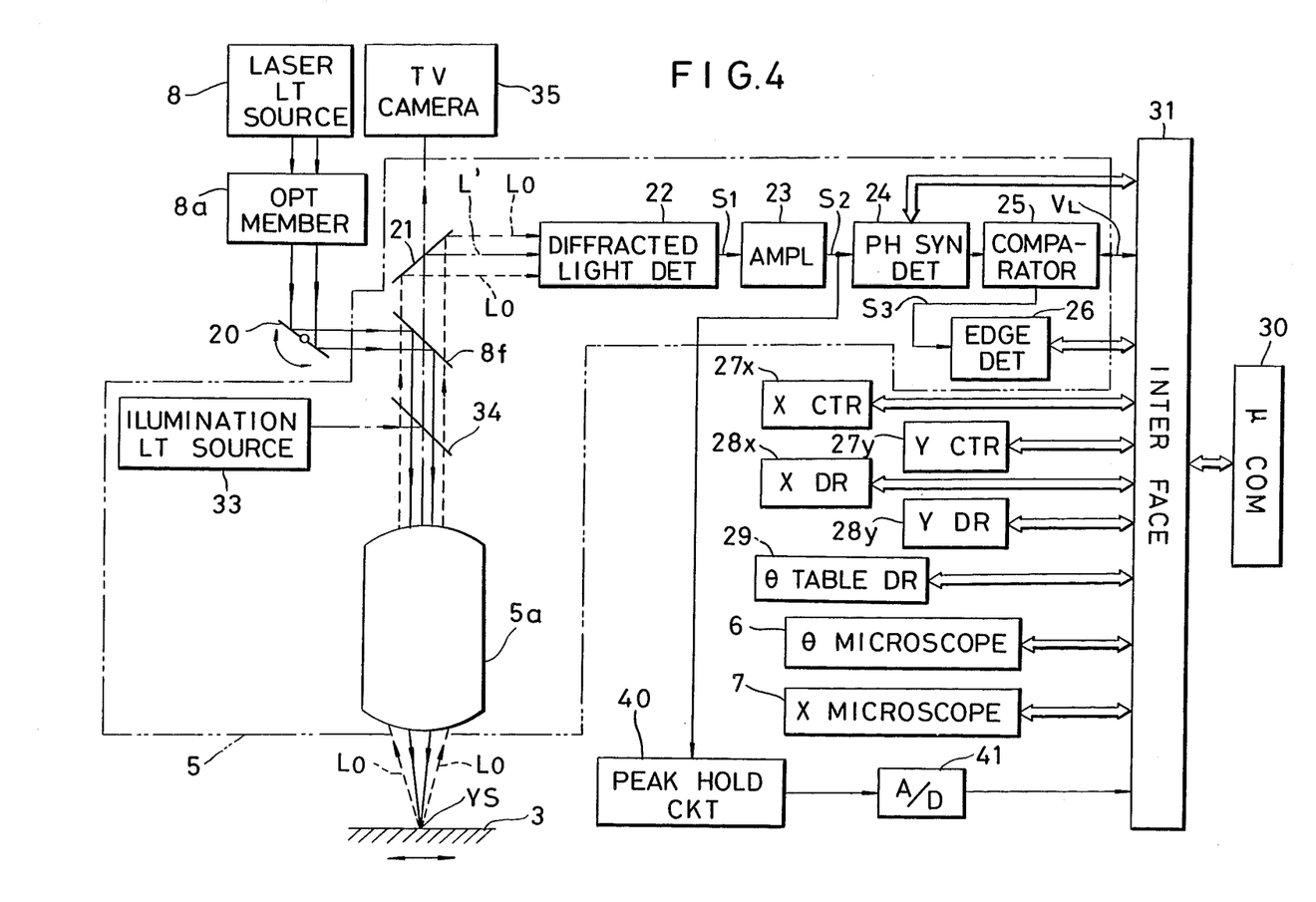
FIG. 4 is a block diagram showing a detection system and a control system for alignment.

FIG. 4 is a block diagram showing a detection system and a control system for the alignment of the wafer 3, through photoelectric detection of the marks YM, θM, XM on the wafer 3. The detection system is shown only for the Y-microscope 5, but it will be understood that a same principle applies also to the θ-microscope 6 and the X-microscope 7. Though unrepresented in FIG. 1, the laser beam emitted from the laser light source 8 and the optical member 8a is deflected by a small angle by means of a mirror 20 vibrating with a determined small angular amplitude. The laser beam from the vibrating mirror 20 enters the Y-microscope 5 after being reflected by the aforementioned mirror 8f composed of a half mirror. Thus the light spot YS slightly vibrates in the Y-direction which is orthogonal to the longitudinal direction of the light spot. The diffracted light Lo from the mark YM1 enters an objective lens 5a of the Y-microscope 5, then passes the mirror 8f, is reflected by a dichroic mirror 21 and enters a diffracted light detector 22. Said detector is composed of a spatial filter intercepting the normal reflected light L' from the wafer 3 but transmitting the diffracted light alone, a lens for converging said diffracted light Lo and a photoelectric detector for receiving thus converged diffracted light Lo and generating photoelectric signal S1 corresponding to the intensity of said light. Said signal S1 is amplified by a determined degree in an amplifier 23 and enters a phase synchronous detecting circuit (hereinafter called PSD) 24. The PSD 24 receives a signal of a frequency f for causing the vibration of the mirror 20 and another signal of a doubled frequency 2f, and perform phase synchronous detection of the photoelectric signal S1 modulated with the frequency f according to either of the above-mentioned signals. A detection output signal S2 obtained by phase synchronous detection of the photoelectric signal S1 with a frequency 2f is supplied to a comparator 25 which performs comparison with a determined reference level VL and binary digitizes said signal S2. The obtained binary signal S3 is supplied to an edge detecting circuit 26 for generating edge signals corresponding to the start and end of the binary signal S3.

Interferometer counters 27x, 27y generate pulses in response to the photoelectric signals corresponding to the interference patterns in the X-interferometer block 9 and Y-interferometer block 10 and count said pulses. The counters consist of an X-counter 27x for detecting the position of the stage 4 in the X-direction, and a Y-counter 27y for detecting the position of the stage 4 in the Y-direction. There are further provided stage driving circuits 28x, 28y for driving the driving units 13, 14 for the stage 4, and a θ-table driving circuit 29 for driving a motor for rotating the θ-table 4a on the stage 4. The above-described detecting system and control system are collectively controlled by a microcomputer (μCOM) 30. Through an interface circuit (IFC) 31, the microcomputer 30 performs operations with respect to the output of the reference level VL, input of the edge signals from the edge detecting circuit 26, input of the detection output signal S4 obtained by detection in the PSD 24 with the frequency f, input of the counts from the X- and Y-interferometer counters 27x, 27y and output of the driving information to the driving circuits 28, 29. The Y-microscope 5 is further provided with an illumination light source 33 for observing a local area including the light spot YS, and the light from said light source 33 is reflected by the half mirror 34 and enters the objective lens 5a to illuminate the wafer 3. A television camera 35 displays the image observed in the viewing field of the objective lens 5a on a cathode ray tube. Although the foregoing description is limited to the Y-microscope 5, the θ-microscope 6 and X-microscope 7 are equipped with detection systems comprising diffracted light detectors, comparators, PSD's in identical manner and collectively controlled by the microcomputer 30. The θ-microscope 6 and X-microscope 7 also receive the laser beam supplied from the laser light source 8 through the optical member 8a and mirror 20, though the light paths are not shown. The light spot θS performs a slight vibration in the Y-direction while the light spot XS performs a slight vibration in the X-direction. The amplitudes of the vibration of the light spots YS, θS, XS are selected for example substantially equal to the width of the marks.

Figure 5:
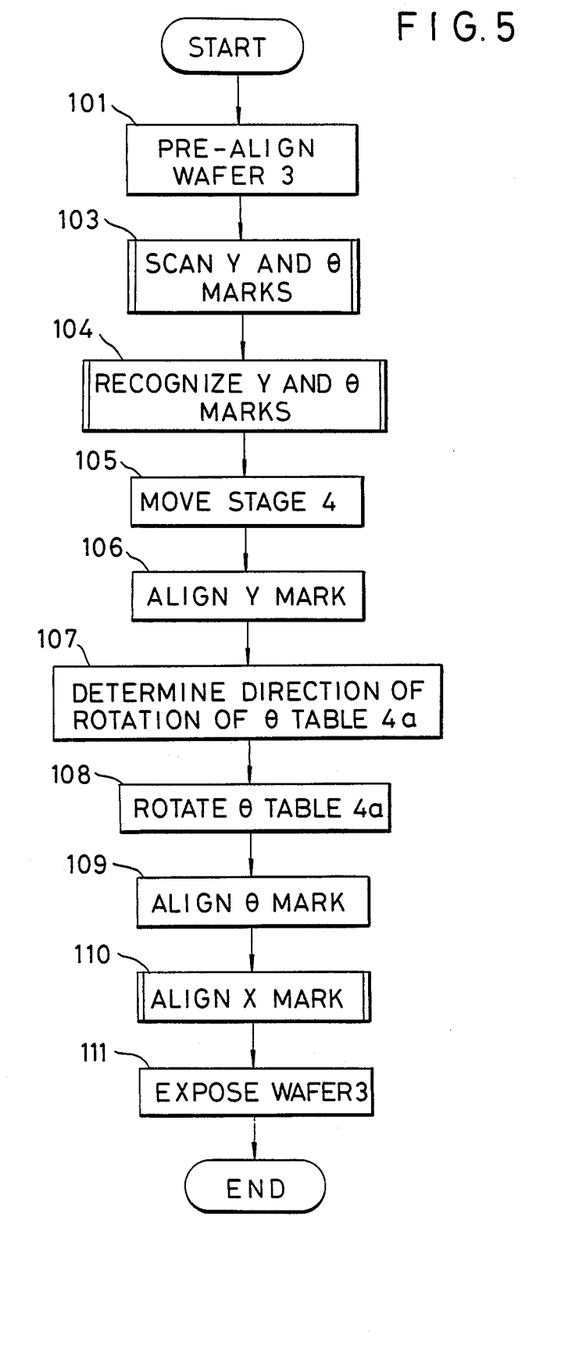
FIG. 5 is a flow chart of the wafer aligning procedure.
Figures 6A, 6B:
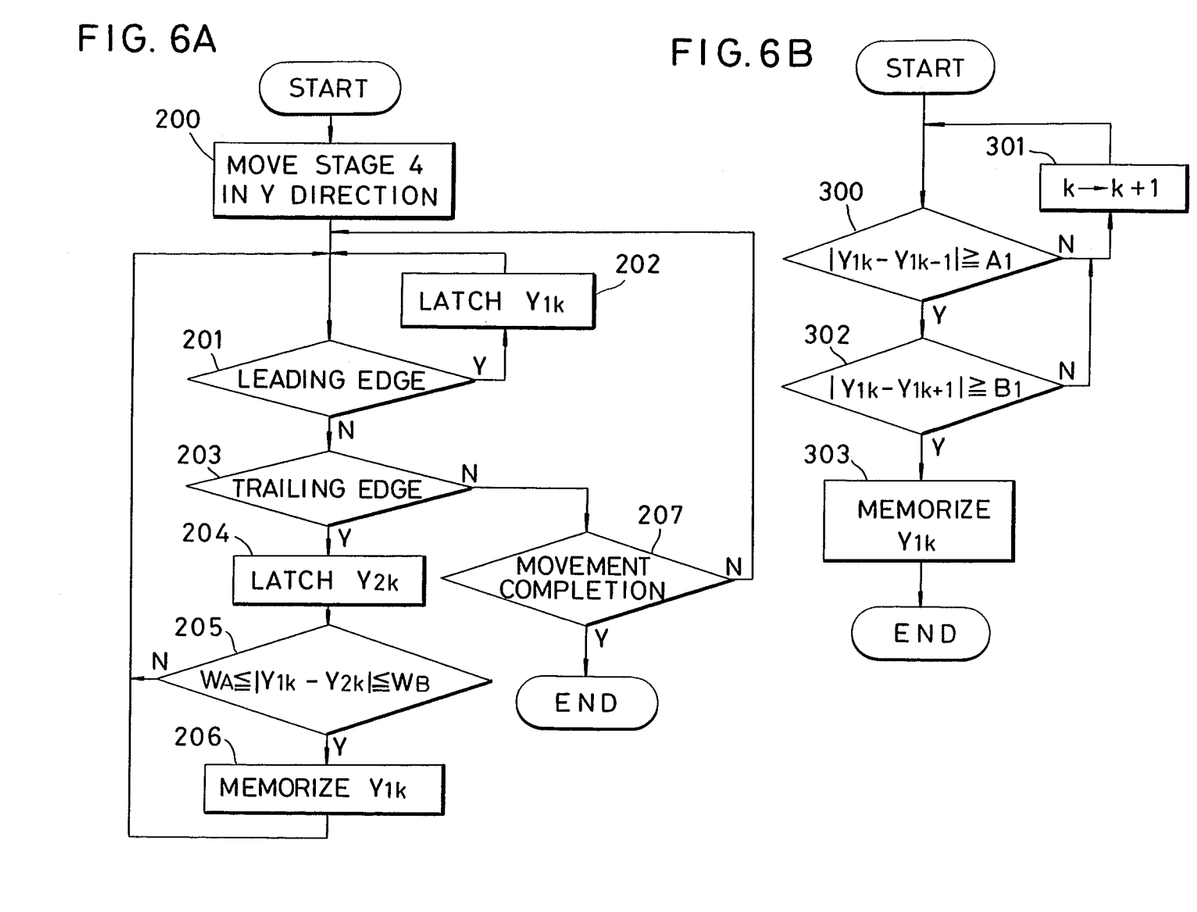
FIG. 6A is a flow chart showing a procedure for detecting a pattern suspected as a mark.
FIG. 6B is a flow chart showing a procedure for identifying a mark.
Figure 7:
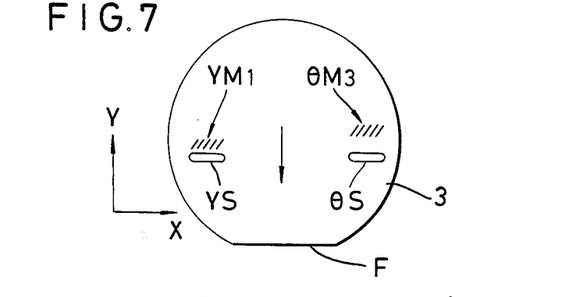
FIG. 7 is a plan view showing the positional relationship between the light spot and the wafer after pre-alignment.
Figure 8:
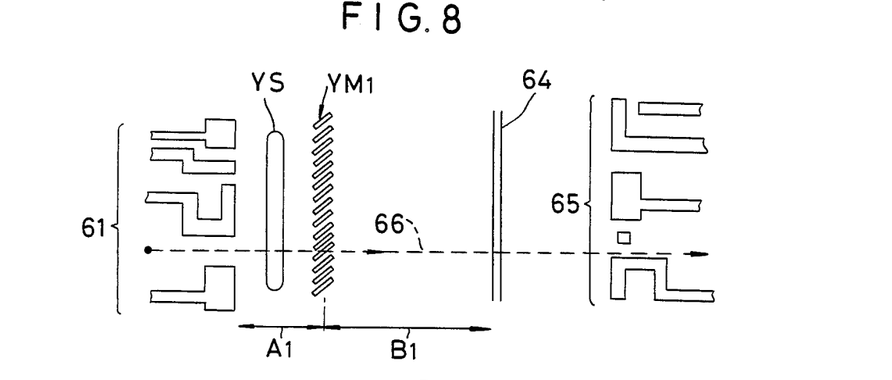
FIG. 8 is a plan view showing the positional relationship between the light spot and patterns and marks formed on the wafer.

Now reference is made to flow charts shown in FIGS. 5 and 6 for explaining the procedure of wafer alignment in the apparatus of the present invention. At first in a step 101, the wafer 3 shown in FIG. 2 is pre-aligned by means of an unrepresented pre-alignment mechanism in such a manner that the flat F becomes parallel to the X-axis of the coordinate system of the stage 4. Then the wafer 3 is transported onto the θ-table 4a of the stage 4 by means of an unrepresented transporting device while the flat F is maintained parallel to the X-axis of the stage 4, and the stage 4 is then moved to bring the wafer 3 under the Y-microscope 5 and the θ-microscope 6. In this state, the mark YM1 (Y mark) and the mark θM3 (θ mark) on the wafer 3 are positioned with a determined relation to the light spots YS and θS according to the precision of the pre-alignment of the wafer 3. FIG. 7 shows the arrangement of the wafer 3 and the light spots YS, θS in said state. In FIG. 7, the wafer 3 is placed on the stage 4 with a rotational error and a translational error in the X- and Y-directions. Then, in a step 103, the microcomputer 30 executes laser scanning of the θ and Y marks. This is achieved by moving the stage 4 in the Y-direction to scan the marks YM1 and θM3 respectively with the light spots YS and θS. The amount of said movement is selected sufficiently larger than the sum of the tolerance of the pre-alignment of the wafer 3 and the length of pattern-free areas which are provided, as will be explained later, in front of and behind the marks YM1 and θM3 along the scanning direction of the stage 4. FIG. 8 shows the mode of scanning, by the light spot YS, a determined range including the mark YM1 on the wafer in said step 103. Though the stage 4 supporting the wafer 3 moves in the Y-direction in practice, it is assumed, for the ease of explanation, that the light spot YS moves on the wafer 3 in a direction represented by an arrow 66. The pattern-free areas mean areas defined in front of and behind the mark YM1 in the scanning direction, in which the formation of circuit patterns 61, 65 is forbidden. In the present embodiment there are provided pattern-free areas A1, B1 in front of and behind the mark YM1. In FIG. 8, it is to be noted that a scribe line 64 is provided between the mark YM1 and the circuit pattern 65 as a boundary between chips.

Figure 9:
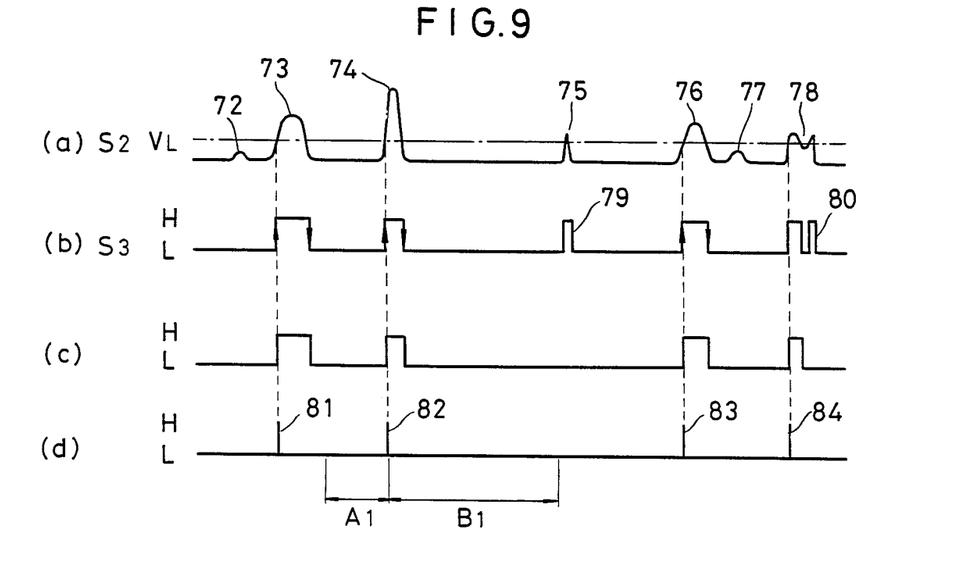
FIG. 9 is a timing chart showing various signals obtained by scanning with the light spot shown in FIG. 8.

Upon execution of the step 103, the microcomputer 30 detects the mark positions on the wafer 3 in response to the diffracted light from the wafer 3 and according to a procedure of the flow chart shown in FIG. 6A. In the following said procedure will be explained in relation to a triming chart shown in FIG. 9. At first, in a step 200, the stage 4 starts movement in the Y-direction with a determined speed, whereby the light spot YS performs scanning motion from the left-hand end to the right-hand end as shown in FIG. 8. With the movement of said light spot YS in the direction of the arrow 66, the detection output signal S2 shows, as represented by a curve (a) in FIG. 9, peaks 72, 73 corresponding to the circuit pattern 61, a larger peak 74 corresponding to the mark YM1, a smaller peak 75 corresponding to the scribe line 64, and peaks 76, 77, 78 corresponding to the circuit pattern 65. Said detection output signal S2 is compared with a reference level VL in the comparator 25, which generates a binary signal S3 assuming the high (H) level stage when the output signal S2 exceeds said reference level VL. In said detection output signal S2, the peaks 72, 77 smaller than said reference level VL are disregarded. In a step 201, the microcomputer 30 detects the edge signals from the edge detecting circuit 26, and, if it is a leading edge, a step 202 latches the value $Y_{1k}$ of the Y-counter 27y of the interferometer counter and the step 201 is repeated again to detect the leading edge. Subsequently the microcomputer 30 monitors, in a step 203, the edge signal from the edge detecting circuit 26, and, if a trailing edge is detected, a step 204 latches the value $Y_{2k}$ of the Y-counter 27y. The values $Y_{1k}$ and $Y_{2k}$ indicate the positions of the leading edge and the trailing edge of a k-th pulse obtained in the movement of the stage 4 in the Y-direction. In a step 205, the microcomputer 30 calculates the absolute difference of the values $Y_{1k}$ and $Y_{2k}$, namely the amount of movement of the stage 4 in the Y-direction while the detection output signal S2 remains larger than the reference level VL, and discriminates whether said absolute value $|Y_{1k}-Y_{2k}|$ lies between predetermined values WA and WB. The width of the mark YM1 in the Y-direction is already known from the design. Thus, if the absolute value $|Y_{1k}-Y_{2k}|$ lies between a value WA slightly larger than the width of the mark and a value WB slightly smaller than said width, there is discriminated the reception of diffracted light from a pattern resembling the mark YM1. Unless this condition is satisfied, the detected signal cannot be the mark and the procedure is repeated from the step 201. On the other hand, if said condition is satisfied, the microcomputer 30 stores the value $Y_{1k}$, or the position of the latched leading edge in a step 206, and repeats the procedure from the step 201. A curve (c) in FIG. 9 shows a binary signal obtained from the binary signal S3 after filtering according to the condition of the step 205. Pulses 79, 80 shown in the curve (b) in FIG. 9 are too narrow to satisfy the above-mentioned condition, and are therefore erased in the curve (c). The values Y1 stored in the step 206 represent, as shown in (d), four positions 81, 82, 83, 84 corresponding to the leading edges of the binary signals shown by the curve (c). If the trailing edge is not detected in the step 203, the program proceeds to a step 207, in which the microcomputer 30 identifies if the light spot YS has moved a determined distance corresponding to the right-hand end shown in FIG. 8, and, if not, repeats the procedure from the ste 201.

The microcomputer 30 terminates the movement of the stage 4 when the candidate positions 81, 82, 83, 84 of the mark YM1 in the Y-direction are determined through the above-described level discrimination whether the detection output signal S2 has a level higher than the determined value, and the width discrimination whether the duration of said signal resembles the width of the mark. The above-described procedure is simultaneously conducted in the same manner for the light spot θS to store the candidate positions of the mark θM3 in the Y-direction in the microcomputer 30.

Then the microcomputer 30 executes a step 104. As shown in FIG. 6B, said step 104 discriminates whether each of said candidate positions satisfies a condition of mark formation, i.e. a condition of absence of any patterns in the areas A1 and B1 in front of and behind the mark YM1. A same discrimination is applied to the candidate positions for the mark θM3. The microcomputer 30 stores the values $Y_{11}$-$Y_{14}$ corresponding to the four candidate positions 81, 82, 83, 84 for the mark YM1 as shown by (d) in FIG. 9. Thus the microcomputer 30 checks, at first for the position 81, the presence of any pattern in the areas A1 and B1 in front of and behind said position 81, according to the flow shown in FIG. 6B.

In said flow, the microcomputer 30 at first determines a condition k=1. A step 300 checks the value of $Y_{1k}$ according to a relation:

$$|Y_{1k}-Y_{1k-1}| \geq A1 \quad (1).$$

The microcomputer 30 proceeds to a step 302 or 301 respectively when the relation (1) is satisfied or not. In the step 301, the value of k is increased by one, and the microcomputer 30 proceeds to the step 300. The step 302 checks the value of $Y_{1k}$ according to a relation:

$$|Y_{1k}-Y_{1k+1}| \geq B1 \quad (2).$$

The microcomputer 30 proceeds to a step 303 or 301 respectively when the relation (2) is satisfied or not. The step 303 stores the value of $Y_{1k}$ satisfying both relations (1) and (2).

According to the above-described procedure, the microcomputer 30 identifies the positions 81, 82, 83, 84 as follows. In front of the position 81, namely at the left side in FIG. 9(d), no pattern exists in the area A1. However, behind or at the right side of the position 81, a candidate pattern 82 exists in the range B1. Based on these facts, the microcomputer 30 identifies that the pattern at the position 81 is not the mark YM1. Then the microcomputer 30 similarly checks the position 82, and identifies the pattern at said position 82 as the mark YM1 since it satisfies the condition for mark formation. Similar checks are conducted for the positions 83, 84 to confirm that the mark YM1 is positioned at 82.

Subsequently the microcomputer 30 reverses the stage 4 in the Y-direction to the position 82 where the value of the Y-counter 27y of the interferometer counter was stored in the step 105, thus positioning the light spot YS on the mark YM1. Usually the spot YS meets the mark YM1 without error by positioning the stage 4 according to the position 82 identified in the step 104. During the above-mentioned operation, the microcomputer 30 applies the procedure of FIG. 6B to the plural candidate positions for the mark θM3, thus identifying a position which satisfies the condition of absence of any pattern in the pattern-free areas A1, B1.

Figure 10:
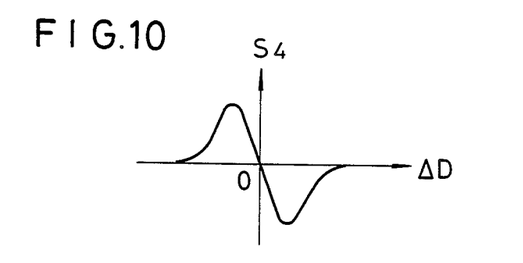
FIG. 10 is a wave-form chart showing an example of a detection output (S-curve) signal.

The mark YM1 generates a strong diffracted light Lo upon meeting the light spot YS. Since the light spot YS vibrates slightly in the Y-direction with an amplitude for example substantially equal to the width of the mark YM1, the detection output signal S4 obtained by the PSD 24 through the synchronous detection with a frequency f assumes an S-shape as shown in FIG. 10, in which the ordinate indicates the magnitude of said detection output signal S4 while the abscissa indicates the aberration ΔD of the center of the mark YM1 in the transverse direction from the center of vibration of the light spot YS. When said aberration ΔD or the detection output signal S4 reaches zero, the center of the mark YM1 coincides with the center of vibration of the light spot YS to achieve the fine alignment. Thus, in a step 106 for fine alignment for the Y mark, the microcomputer 30 finely adjusts the position of the stage 4 in the Y-direction through servo control in response to the detection output signal S4. More specifically the stage driving circuit 28 is servo controlled in such a manner that the detection output signal S4 from the PSD 24 reaches zero or a determined range including zero. In this manner the mark YM1 is precisely positioned at the light spot YS.

In a step 107, the microcomputer 30 identifies the rotational direction of the wafer 3, namely the aberration of the X'-axis of the X'-Y' coordinate system of the wafer 3 from the X-axis of the X-Y coordinate system of the stage 4. This is achieved by an identification whether the difference between the position 82 of the mark YM1 in the Y-direction obtained in the aforementioned step 104 and the position of the mark $\theta$M3 in the Y-direction is positive or negative. If said difference is positive, the wafer 3 is aberrated anticlockwise with respect to the X-Y coordinate system of the stage 4 as shown in FIG. 7, and vice versa. Then, in a step 108 for $\theta$-table rotation, the microcomputer 30 rotates the $\theta$-table 4a in a direction opposite to said rotational aberration. Simultaneously the microcomputer 30 detects the candidate patterns for the mark $\theta$M3 by photoelectrically detecting the diffracted light generated from the light spot $\theta$S, conducting synchronous detection with a frequency $2f$ on thus obtained detection signals to obtain a detection output signal, and binary digitizing said output signal.

Figure 11:
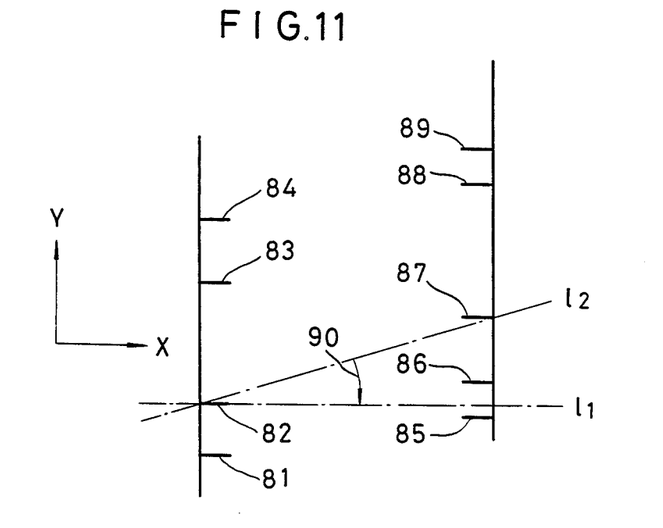
FIG. 11 is a schematic view showing rotational aberration of the wafer.

In this manner there is counted the number of the candidate patterns for the mark $\theta$M3 since the start of rotation of the $\theta$-table 4a, as will be explained in relation to FIG. 11 schematically showing the state of the wafer 3 prior to the rotation of the $\theta$-table 4a. A line $l_1$ connecting the centers of vibration of the light spots YS and $\theta$S is parallel to the X-axis of the X-Y coordinate system of the stage 4. 81, 82, 83 and 84 indicate the candidate positions for the mark YM1 in the Y-direction shown in FIG. 9(d), while 85, 86, 87, 88 and 99 indicate the candidate positions for the mark $\theta$M3 in the Y-direction. The marks YM1, $\theta$M3 were already identified, in the aforementioned step 104, to be at the positions 82 and 87 respectively. Since the rotational center of the $\theta$-table 4a is close to the mark YM1 and since the stage 4 is servo controlled in the Y-direction so as to maintain the light spot YS and the mark YM1 in registration, the light spot YS always remains on the mark YM1 and the mark $\theta$M3 and the light spot $\theta$S perform mutual scanning motion in the Y-direction by the rotation of the $\theta$-table 4a. The microcomputer 30 identifies the relative position of each of the candidate positions 85–89 for the mark $\theta$M3 in the Y-direction with respect to the position 82 of the mark YM1. In the clockwise rotation of the $\theta$-table 4a as indicated by an arrow 90 in FIG. 11, the position 85 does not cross the line $l_1$. Thus the microcomputer 30 disregards said position 85, and detects the position 87 next to the candidate position 86 for the mark $\theta$M3, namely the second signal since the start of rotation of the $\theta$-table 4a. In this operation the microcomputer 30 detects the pattern of the mark $\theta$M3 through the level discrimination and width discrimination in response to the photoelectric signal of the diffracted light detected by the $\theta$-microscope 6. The width in this case is calculated from the rotating speed of the $\theta$-table 4a, since the value of the Y-counter 27y of the interferometer counter is not usable.

Upon start of the rotation of the $\theta$-table 4a, the microcomputer 30 detects the leading and trailing edges from the edge signals supplied from the edge detecting circuit 26 corresponding to the photoelectric signals detected by the $\theta$-microscope 6, then determines the time interval between the leading and trailing edges, and calculates the width between the leading and trailing edges from the relative moving speeds in the Y-direction of the mark $\theta$M3 and the light spot $\theta$S resulting from the rotation of the $\theta$-table 4a. If the detected width Ws satisfies the condition for width discrimination ($W_A \leq W_S \leq W_B$), the corresponding edge signal is identified as the first signal, namely position 86 shown in FIG. 11. The rotation of the $\theta$-table 4a is terminated when the microcomputer 30 similarly detects the second signal corresponding to the position 87 in FIG. 11. In this state the line $l_2$ connecting the positions 82 and 87 shown in FIG. 11, namely the X'-axis of the X'-Y' coordinate system coincides with the line $l_1$.

Then the microcomputer 30 executes a step 109 shown in FIG. 5 for fine alignment of the $\theta$ mark, by servo control of the rotation of the $\theta$-table 4a, in response to the detection output signal obtained by synchronous detection with a frequency f of the photoelectric signal detected by the $\theta$-microscope 6, so as that the center of the mark $\theta$M3 in the cross direction coincides with the center of vibration of the light spot $\theta$S. This control is so conducted as to bring the signal S4 shown in FIG. 10 to zero as already explained in relation to the step 107. During said step 109, the servo control of the stage 4 in the Y-direction by the step 106 is naturally continued, so that the marks YM1 and $\theta$M3 are simultaneously aligned. In this manner the center of the mark YM1 in the width direction coincides with the center of vibration of the light spot YS while the center of the mark $\theta$M3 in the width direction codincides with the center of vibration of the light spot $\theta$S whereby the rotational aberration between the X-Y coordinate system of the stage 4 and the X'-Y' coordinate system of the wafer 30 is precisely connected. Subsequently the microcomputer 30 stores, in the Y-counter 27y of the interferometer counter, a value corresponding to the distance in the Y-direction between the optical axis 1 of the projection lens 2 and the line $l_1$ connecting the light spots YS and $\theta$S, thereby defining the wafer 3 in the Y-direction with respect to the optical axis 1 of the projection lens 2.

Then, in a step 110 for X-alignment, the microcomputer 30 brings the mark XM2 to the light spot XS in the same manner as the aforementioned detection and alignment of the marks YM1 and $\theta$M3, and further conducts fine alignment in the X-direction by synchronous detection. Subsequently, the microcomputer 30 stores, in the X-counter 27x of the interferometer counter, a value corresponding to the distance in the X-direction from the optical axis 1 of the projection lens 2 to the light spot XS generated by the X-microscope 7, thereby defining the position of the wafer 3 in the X-direction with respect to the optical axis 1 of the projection lens 2. In this manner the global alignment by the off-axis method is completed.

Thereafter the microcomputer 30 executes an exposure operation in a step 111, and repeats the exposure of the circuit pattern of the reticle 1 onto the wafer 3 by stepping the stage 4 in the X- and Y-directions in response to the measured values in the interferometer counters.

As explained in the foregoing, the present embodiment allows identification of the real marks, even when the pre-alignment of the wafer 3 is not precise enough, based on conditions whether the photoelectric signal corresponding to the intensity of the diffracted light exceeds a reference level VL and whether the width thereof lies in a determined range close to the width of the mark, and also whether any pattern exists in the determined areas A1, B1 in front of and behind the mark, and it is therefore rendered possible to exactly decide the rotational aberration of the wafer 3 and the translational aberrations thereof in the X- and Y-directions.

In the foregoing embodiment the width of the edge signal is determined in the step 108 from the rotating speed of the θ-table 4a, but it can also be determined from an output signal of an encoder which can precisely determine the amount of rotation of the θ-table 4a. Also in case such encoder is available, it is possible to execute the step 109 after determining, in the step 107, the aberration of the positions 82 and 87 in the Y-direction, calculating the amount of rotation of the θ-table 4a corresponding to said aberration and rotating the θ-table 4a by said amount in response to the output signal from said encoder.

Figure 12:
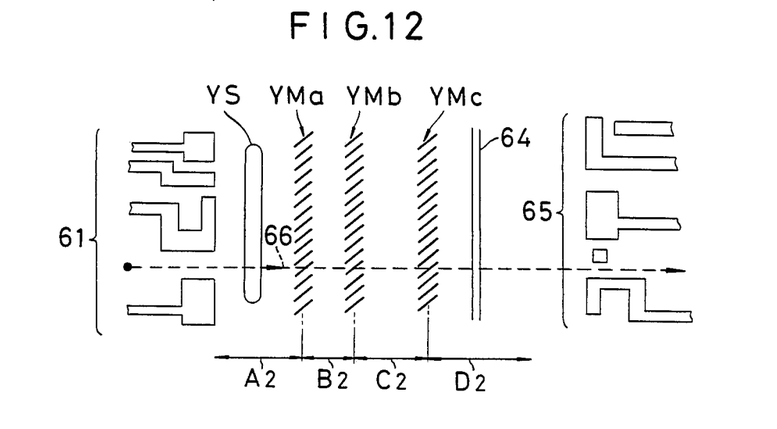
FIG. 12 is a plan view showing the mark positions in a second embodiment of the present invention.
Figure 13:
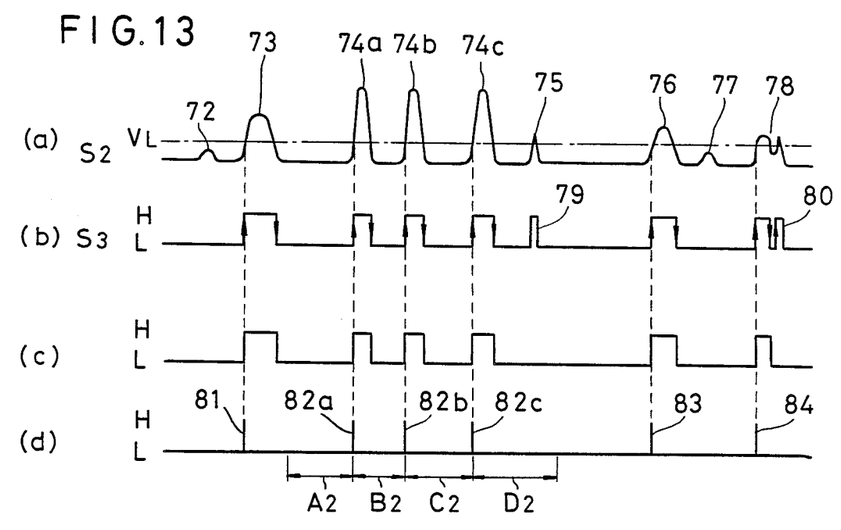
FIG. 13 is a timing chart showing various signals obtained by scanning, with a light spot, the patterns and marks shown in FIG. 12.

Now reference is made to FIGS. 12 and 13 for explaining a second embodiment of the present invention, in which the plural marks YM, θM, XM are positioned differently from the foregoing embodiment and are positioned at determined intervals in the scanning direction of the light spot. FIG. 12 is a plan view showing the positions of said marks and other circuit patterns on the wafer 3. In FIG. 12, on the wafer 3 bearing the circuit patterns the same as those shown in FIG. 8, mutually parallel three marks YMa, YMb, YMc are formed as the Y mark. The marks YMa and YMb are spaced by a predetermined distance B2 in the scanning direction of the light spot YS, while the marks YMb and YMc are spaced by a predetermined distance C2, and said marks are formed at predetermined positions with respect to the circuit patterns. In the present embodiment the distance B2 is different from the distance C2, but said distances may be mutually equal. Said three marks YMa, YMb, YMC have the same lattice patterns which generate diffracted light of a same intensity when illuminated by the light spot YS. The θ mark and the X mark are also constructed in the same manner. The alignment of the wafer 3 is conducted according to a procedure shown in FIG. 5, except that the discrimination of the condition for mark formation in the step 104 is conducted differently. In response to the scanning motion of the light spot YS in the direction 66, as shown in FIG. 12, in the step 103, the detection output signal S2 shows, as indicated by a curve (a) in FIG. 13, peaks 74a, 74b, 74c corresponding to the strong diffracted light from the marks YMa, YMb, YMc in addition to the peaks corresponding to the diffracted light from the circuit patterns. The binary encoding of said output signal S2 provides a binary signal S3 represented by a curve (b), which is further converted with width discrimination into a signal represented by a curve (c). From said signal the positions 81, 82a, 82b, 82c, 83 and 84 of the leading edges are detected.

Figure 14:
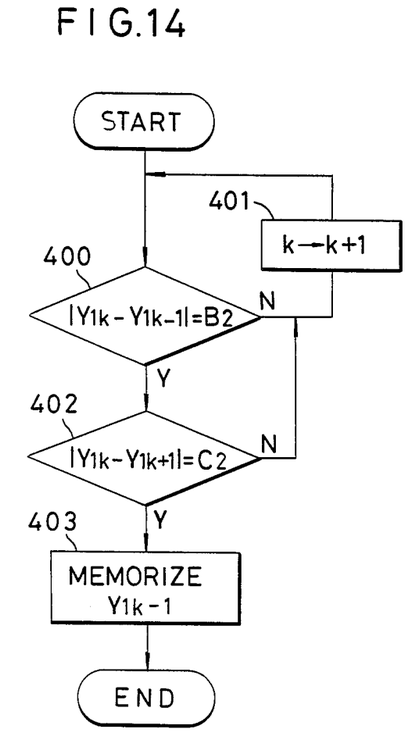
FIG. 14 is a flow chart showing a procedure for mark identification in the second embodiment.

In the following there will be explained flow chart shown in FIG. 14. At first the microcomputer 30 sets a condition k=1. A step 400 checks the value of $Y_{1k}$ according to a relation:

$$|Y_{1k} - Y_{1k-1}| = B2 \quad (3).$$

The microcomputer 30 proceeds to a step 402 or 401 respectively when the relation (3) is satisfied or not. The step 401 increases the value of k by one, and the microcomputer 30 proceeds to the step 400. The step 402 checks the value of $Y_{1k}$ according to a relation:

$$|Y_{1k} - Y_{1k-1}| = C2 \quad (4).$$

The microcomputer 30 proceeds to a step 403 or 401 respectively when the relation (4) is satisfied or not. The step 403 stores the value of $Y_{1k-1}$ satisfying both the relations (3) and (4).

Thus, in the step 104 of the above-mentioned flow chart, the microcomputer identifies the positions 82a, 82b, 82c as the marks YMa, YMb, YMc based on the result of detection that the positions 82a and 82b are distanced by B2 and that the positions 82b and 82c are distanced by C2. In this case there may be added a discrimination by pattern-free areas, for example by the absence of any pattern in an area A2 in front of the mark YMa and in an area D2 behind the YMc. Though a scribe line 64 exists in said area D2 in case of FIG. 12, but such line does not remain, in most cases, in the final signal as shown in (d) since such line, not designed to generate a strong diffracted light, only provides a small and narrow peak 75 in the detection output signal S2. In such case the scribe line 64 may exist in the pattern-free areas. Nevertheless such scribe line should preferably be positioned outside said pattern-free areas in order to avoid eventual erroneous detection, since such scribe line 64 may generate a strong diffracted light depending on the wafer manufacturing process. In the step 105, the stage 4 is moved for example to the position 82a, thereby bringing the mark YMa to the light spot YS. Naturally it is possible to use the mark YMb or YMc instead, according to the convenience. The step 403 stores the value of $Y_{1k}$ or $Y_{1k+1}$ respectively when the mark YMb or YMc is employed.

As explained in the foregoing, the second embodiment significantly improves the percentage of recognition in the step 104, thereby enabling secure detection of the marks.

Figure 15:
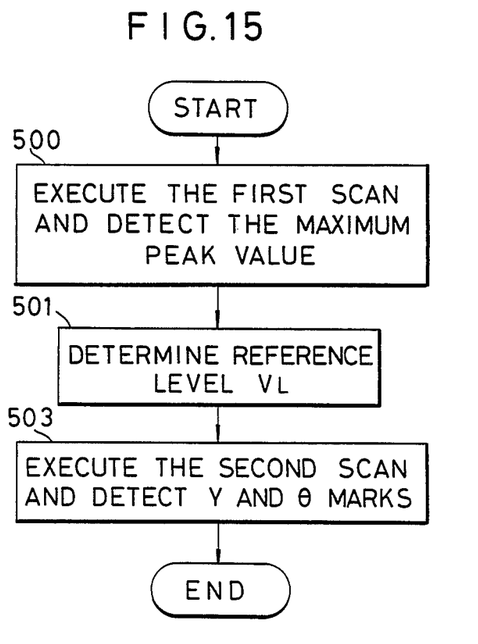
FIG. 15 is a flow chart showing the function of a third embodiment of the present invention.

Now there will be explained a third embodiment of the present invention. Referring to FIG. 4, the reference level VL supplied to the comparator 25 may be arbitrarily changed according to the instruction of the microcomputer 30, through the use of a digital-to-analog converter. Thus, in the present embodiment, the circuit shown in FIG. 4 is further provided with a peak-hold circuit 40 for holding the maximum value of the detection output signal S2, and an analog-to-digital converter 41 for supplying thus held peak value to the microcomputer 30 through an interface 31. Also in the step 103 shown in FIG. 5, the scanning of a mark-containing range with the light spot is conducted twice, in forward and backward motions, as will be further explained in relation to a flow chart shown in FIG. 15. A step 500 executes a first scanning and activates the peak-hold circuit 40 to hold the maximum peak of the detection output signal S2. In a step 501, the microcomputer 30 reads said maximum value, and regulates the reference level VL in a range from 70 to 80% of said peak value. Then a step 503 scans the wafer 3 in the opposite direction to detect the edge positions of the binary signal S3. The signal obtained by binary digitizing the detection output signal S2 shown in FIG. 9 or 13 only shows the pulses corresponding to the marks and does not show the peaks corresponding to the weak diffracted light from the circuit patterns because the intensity of the diffracted light from the marks is far larger. However, mark identification is confirmed by the discrimination of the condition of mark formation as in the foregoing embodiments, since the circuit patterns may generate similarly intense diffracted light in case the pre-alignment is not precise enough and the circuit patterns are fine. The third embodiment is advantageous in enabling easier and securer mark recognition, since the binary digitization is conducted on the detection output signal S2 corresponding to the diffracted light of a very high intensity such as the diffracted light from the mark.

The present invention has been explained by certain embodiments thereof, but it should be understood that various modifications are possible.

In the foregoing embodiments the light spots YS, θS and MS vibrate slightly, but it is also possible to employ non-vibrating light spots. In such case the photoelectric signal corresponding to the diffracted light assumes a wave form similar to that of the detection output signal S2. Also it becomes difficult to achieve precise alignment since the phase synchronous detection circuit cannot be used when the light spots do not vibrate. It is therefore desirable, in such case, at the scanning of the wafer 3 with the light spot, to sample the photoelectric signal corresponding to the diffracted light with count pulses (for example a pulse for every 0.02 $\mu$m) supplied to the interferometer counter 27, to convert thus sampled signals into digital values, and to store said digital values in succession in a memory. The alignment corresponding to the resolving power of the laser interferometer is made possible by detecting the mark positions through so-called wave form processing, namely a process for extracting candidate wave forms for the mark from thus stored wave forms of the photoelectric signal. The condition of mark formation is naturally checked at the same time.

In the foregoing embodiments the light spots are formed oblong in a direction orthogonal to the scanning direction, but a similar effect can be obtained if the light spots and the marks are inclined by a determined angle (for example 45°) to the scanning direction. Also in the foregoing embodiments each mark is composed of a linear array of small linear elements inclined by 45°, but the angle of inclination is not limited to 45°.

Also in case of forming plural same marks as in the second embodiment, it is possible also to recognize the mark by comparing plural peaks in the candidate patterns through the calculation of correlation, utilizing a fact that the peaks 74a, 74b, 74c corresponding to the marks in the detection output signal S2 become mutually identical. This method has an advantage of providing a high recognition rate even when plural marks are deformed in the same manner for example by development or etching of the wafer. Furthermore the light spot need not be oval but can be circular, and the mark need not be a lattice-shaped pattern but can be composed of a single stripe or plural stripes arranged in the scanning direction. In this case the photoelectric detection can be made on the light scattered at the edge of the stripe-shaped pattern. Also instead of the mark detection with the light spot of a laser beam, there may be employed a so-called photoelectric microscope with a vibrating slit in which the image of the mark formed through the objective lens is detected photoelectrically through a vibrating slit.

Furthermore, the present invention provides the same effects when it is applied to an exposure apparatus in which the marks on the wafer are observed and detected by the through-the-lens (TTL) method.

We claim:

1. An apparatus for aligning a substrate bearing at least a reference pattern and other plural patterns on the surface thereof, comprising:
   (a) means for directing a radiation onto a determined area on the surface of said substrate, said determined area being extended to cross said reference pattern at a determined angle and including said reference pattern and said other plural patterns;
   (b) detecting means for detecting, in response to said radiation reflected in said determined area, that said reference pattern and said other plural patterns are arranged in a determined positional relationship along a direction crossing said reference pattern at said determined angle and for generating corresponding detection signals; and
   (c) means for positioning said substrate in response to said detection signals in such a manner that said reference pattern is aligned to a determined position with respect to said apparatus;
   wherein said detecting means comprises:
      means for detecting the absence of said other plural patterns between a position spaced by a first distance from said reference pattern and said reference pattern along a direction crossing said reference pattern at said determined angle; and
      means for detecting the absence of said other plural patterns between a position spaced by a second distance from said reference pattern and said reference pattern in the opposite direction crossing said reference pattern at said determined angle.

2. An apparatus for aligning a substrate bearing at least a reference pattern and other plural patterns on the surface thereof, comprising:
   (a) means for directing a radiation onto a determined area on the surface of said substrate, said determined area being extended to cross said reference pattern at a determined angle and including said reference pattern and said other plural patterns;
   (b) detecting means for detecting, in response to said radiation reflected in said determined area, that said reference pattern and said other plural patterns are arranged in a determined positional relationship along a direction crossing said reference pattern at said determined angle and for generating corresponding detection signals; and
   (c) means for positioning said substrate in response to said detection signals in such a manner that said reference pattern is aligned to a determined position with respect to said apparatus;
   wherein said other plural patterns comprise first and second comparison patterns neighboring said reference pattern in said determined area, and wherein said detecting means comprises:
   means for detecting the presence of said first comparison pattern at a position spaced by a first distance from said reference pattern along a direction crossing said reference pattern at said determined angle; and
   means for detecting the presence of said second comparison pattern at a position spaced by a second distance from said reference pattern along the opposite direction crossing said reference pattern at said determining angle.

3. An apparatus for aligning a substrate bearing at least a reference pattern and other plural patterns on the surface thereof, comprising:
   (a) first means for scanning, with a radiation, a determined area on the surface of said substrate, said determined area being extended to cross said reference pattern at a determined angle and including said reference pattern and said other plural patterns;

(b) first means for forming signals corresponding to the distribution of said reference pattern and said other plural patterns in said determined area, in response to said radiation reflected in said determined area in the scanning with said radiation by said first scanning means;

(c) means for detecting the maximum of the signal formed by said first signal forming means and calculating a reference value as a determined ratio to said maximum;

(d) second means for scanning said determined area with said radiation in response to the calculation of said reference value;

(e) second means for forming signal corresponding to the distribution of said reference pattern and said other plural patterns in said determined area, in response to said radiation reflected in said determined area, in the scanning with said radiation by said second scanning means; and (f) means for comparing the signals formed by said second signal forming means with said reference value.

4. A method of controlling an apparatus for aligning a substrate bearing at least a reference pattern and other plural patterns on the surface thereof, comprising:

(a) directing a radiation onto a determined area on the surface of said substrate, said determined area being extended to cross said reference pattern at a determined angle and including said reference pattern and said other plural patterns;

(b) detecting, in response to said radiation reflected in said determined area, that said reference pattern and said other plural patterns are arranged in a determined positional relationship along a direction crossing said reference pattern at said determined angle and generating corresponding detection signals; and (c) positioning said substrate in response to said detection signals in such a manner that said reference pattern is aligned to a determined position with respect to said apparatus;

wherein said detecting step comprises:
detecting the absence of said other plural patterns between a position spaced by a first distance from said reference pattern and said reference pattern along a direction crossing said reference pattern at said determined angle; and
detecting the absence of said other plural patterns between a position spaced by a spaced distance from said reference pattern and said reference pattern in the opposite direction crossing said reference pattern at said determined angle.

5. A method of controlling an apparatus for aligning a substrate bearing at least a reference pattern and other plural patterns on the surface thereof, comprising:

(a) directing a radiation onto a determined area on the surface of said substrate, said determined area being extended to cross said referene pattern at a determined angle and including said reference pattern and said other plural patterns;

(b) detecting, in response to said radiation reflected in said determined area, that said reference pattern and said other plural patterns are arranged in a determined positional reltaionship along a direction crossing said reference pattern at said determined angle and generating corresponding detection signals; and (c) positioning said substrate in response to said detection signals in such a manner that said reference pattern is aligned to a determined position with respect to said apparatus;

wherein said other plural patterns comprise first and second comparison patterns neighboring said reference pattern in said determined area, and wherein said detecting step comprises:
detecting the presence of said first comparison pattern at a position space by a first distance from said reference pattern along a direction crossing said reference pattern at said determined angle; and
detecting the presence of said second comparison pattern at a position spaced by a second distance from said reference pattern along the opposite direction crossing said reference pattern at said determined angle.

6. An apparatus for aligning a substrate bearing a reference pattern and other plural patterns on the surface thereof comprising:

(a) means for scanning with a radiation, said substrate in a determined direction crossing said reference pattern at a determined angle;

(b) producng means responsive to said radiation reflected by said substrate for producing pattern signals;

(c) discriminating means responsive to said pattern signals for discriminating the pattern signal corresponding to said reference pattern from the pattern signals corresponding to said other plural patterns on the basis of a condition which accords with a determined positional relationship between said reference pattern and said other plural patterns along said determined direction, said discriminating means comprising means for detecting the absence of said other plural patterns between a position spaced by a first distance from said reference pattern and said reference pattern along a direction crossing said reference pattern at said determined angle, and means for detecting the absence of said other plural patterns between a position spaced by a second distance from said reference pattern and said reference pattern in the opposite direction crossing said reference pattern at said determined angle; and (d) means for positioning said substrate in response to the pattern signal discriminated by said discriminating means in such a manner that said reference pattern is aligned to a determined position with respect to said apparatus.

7. An apparatus for aligning a substrate bearing a reference pattern and other plural patterns on the surface thereof, said other plural patterns including first and second comparison patterns neighboring said reference pattern, said apparatus comprising:

(a) means for scanning with a radiation, said substrate in a determined direction crossing said reference pattern at a determined angle;

(b) producing means responsive to said radiation reflected by said substrate for producing pattern signals;

(c) discriminating means responsive to said pattern signals for discriminating the pattern signal corresponding to said reference pattern from the pattern signals corresponding to said other plural patterns on the basis of a condition which accords with a determined positional relationship between said reference pattern and said other plural patterns along said determined direction, said discriminating means comprising means for detecting the presence of said first comparison pattern at a position spaced by a first distance from said reference pattern along a direction crossing said reference pattern at said determined angle, and means for detecting the presence of said second comparison pattern at a position spaced by a second distance from said reference pattern along the opposite direction crossing said reference pattern at said determined angle; and (d) means for positioning said substrate in response to the pattern signal discriminated by said discriminating means in such a manner that said reference pattern is aligned to a determined position with respect to said apparatus.

8. An apparatus for aligning a substrate bearing first and second reference patterns and other plural patterns on the surface thereof, comprising:

(a) pattern detection means having a first detection position and a second detection position on rectangular coordinates;

(b) stage means for supporting said substrate so that said first reference pattern is arranged in a first area which is extended in a determined direction on said rectangular coordinate and said second reference pattern is arranged in a second area which is extended in said determined direction on said rectangular coordinates;

(c) moving means for moving said stage means on said rectangular coordinates, said pattern detection means producing first pattern signals corresponding to the patterns which pass through said first position with the movement of said stage means in said determined direction and producing second pattern signals corresponding to the patterns which pass through said second position with the movement of said stage means in said determined direction;

(d) discriminating means for discriminating a first pattern signal corresponding to said first reference pattern and for discriminating a second pattern signal corresponding to said second reference pattern, said discriminating means discriminating the first pattern signal corresponding to said first reference pattern on the basis of a condition which accords with a determined positional relationship between said first reference pattern and one part of said other plural patterns along said determined direction, said discriminating means discriminating the second pattern signal corresponding to said second reference pattern on the basis of a condition which accords with a determined positional relationship between said second reference pattern and a part of said other plural patterns along said determined direction, said discriminating means including memory means, first counter means for counting the number of said first pattern signal generated during the movement of said first reference pattern in said first area, first order detection means responsive to said first counter means for detecting the order of the generation of the first pattern signal corresponding to said first reference pattern, for producing a first order detection signal and for storing said first order detection signal in said memory means, second counter means for counting the number of said second pattern signals generated during the movement of said second reference pattern in said second area, and second order detection means responsive to said second counter means for detecting the order of the generation of the second pattern signal corresponding to said second reference pattern, for producing a second order detection signal and for storing said second order detection signal in said memory means; and (e) control means responsive to said discriminating means for controlling said moving means to cause said first reference pattern to correspond with said first position and thereafter controlling said moving means to cause said second reference pattern to correspond with said second position.

9. An apparatus according to claim 8, wherein said control means includes means for monitoring said first and second pattern signals in accordance with the content of said memory means.

10. An apparatus for aligning a substrate bearing a reference pattern and other plural patterns on the surface thereof comprising:

(a) means for scanning with a radiation, said substrate in a determined direction crossing said reference pattern at a determined angle;

(b) producing means resposnive to said radiation reflected by said substrate for producing pattern signals;

(c) discriminating means responsive to said pattern signals for discriminating the pattern signal corresponding to said reference pattern from the pattern signals corresponding to said other plural patterns on the basis of a condition which accords with a determined positional relationship between said reference pattern and said other plural patterns along said determined direction, said discriminating means having means for detecting the absence of said other plural patterns between a position spaced by a determined distance from said reference pattern and said reference pattern along one direction crossing said reference pattern at said determined angle; and (d) means for positioning said substrate in response to the pattern signal discriminated by said discriminating means in such a manner that said reference pattern is aligned to a determined position with respect to said apparatus.

11. An apparatus according to claim 10, wherein said discriminating means has means for detecting the absence of said other plural patterns between a position spaced by another determined distance from said reference pattern and said reference pattern along another direction crossing said reference pattern at said determined angle.

12. An apparatus for aligning a substrate bearing a reference pattern and other plural patterns on the surface thereof comprising:

(a) means for scanning with a radiation, said substrate in a determined direction crossing said reference pattern at a determined angle;

(b) producing means responsive to said radiation reflected by said substrate for producing pattern signals;

(c) discriminating means responsive to said pattern signals for discrimianting the pattern signal corresponding to said reference pattern from the pattern signals corresponding to said other plural patterns on the basis of a condition which accords with a determined positional relationship between said reference pattern and said other plural patterns along said determined direction, said discriminating means having means for detecting the presence of one of said other plural patterns at a position spaced by a determined distance from said reference pattern along one direction crossing said reference pattern at said determined angle; and (d) means for positioning said substrate in response to the pattern signal discriminated by said discriminating means in such a manner that said reference pattern is aligned to a determined position with respect to said apparatus.

13. An apparatus according to claim 12, wherein said discriminating means has means for detecting the presence of another of said other plural patterns at a position spaced by another determined distance from said reference pattern along one direction crossing said reference pattern at said determined angle.

* * * * *